United States Patent
Yamamoto

(10) Patent No.: US 12,135,898 B2
(45) Date of Patent: *Nov. 5, 2024

(54) MEMORY SYSTEM

(71) Applicant: Kioxia Corporation, Tokyo (JP)

(72) Inventor: Kensuke Yamamoto, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/520,612

(22) Filed: Nov. 28, 2023

(65) Prior Publication Data

US 2024/0094941 A1    Mar. 21, 2024

Related U.S. Application Data

(63) Continuation of application No. 17/575,749, filed on Jan. 14, 2022, now Pat. No. 11,868,648, which is a (Continued)

(51) Int. Cl.
    *G11C 7/22*      (2006.01)
    *G06F 3/06*      (2006.01)
    (Continued)

(52) U.S. Cl.
CPC .......... *G06F 3/0655* (2013.01); *G06F 3/0604* (2013.01); *G06F 3/0679* (2013.01);
(Continued)

(58) Field of Classification Search
CPC .... G06F 3/0655; G06F 3/0604; G06F 3/0679; G06F 13/1668; G06F 2212/7201; G06F 12/0246; G11C 7/1063; G11C 7/22
See application file for complete search history.

(56) References Cited

U.S. PATENT DOCUMENTS

| | | | |
|---|---|---|---|
| 8,913,448 B2 | 12/2014 | Tamlyn et al. | |
| 9,530,472 B1 | 12/2016 | Park et al. | |

(Continued)

FOREIGN PATENT DOCUMENTS

| | | |
|---|---|---|
| JP | 2013050996 A | 3/2013 |
| JP | 2018163440 A | 10/2018 |

OTHER PUBLICATIONS

International Search Report (ISR) (and English language translation thereof) dated Dec. 10, 2019, issued in International Application No. PCT/JP2019/036211.

(Continued)

*Primary Examiner* — Jay W. Radke
(74) *Attorney, Agent, or Firm* — Holtz, Holtz & Volek PC

(57) ABSTRACT

A semiconductor memory device includes a memory cell storing data; a signal pad inputting write data to the memory cell and from which read data read from the memory cell is output to an external controller; a first control pad receiving a first timing control signal from the external controller; and a second control pad outputting a second timing control signal to the external controller. In a first time period after a data out command is received, dummy data are output from the signal pad while the second timing control signal from the second control pad is toggling in response to toggling of the first timing control signal input to the first control pad. In a second time period after the first time period, read data are output from the signal pad while the second timing control signal is toggling in response to toggling of the first timing control signal.

20 Claims, 13 Drawing Sheets

Related U.S. Application Data continuation of application No. PCT/JP2019/036211, filed on Sep. 13, 2019.

(51) Int. Cl.
*G06F 13/16* (2006.01)
*G11C 7/10* (2006.01)

(52) U.S. Cl.
CPC ........ *G06F 13/1668* (2013.01); *G11C 7/1063* (2013.01); *G11C 7/22* (2013.01)

(56) References Cited

U.S. PATENT DOCUMENTS

| | | | |
|---|---|---|---|
| 10,032,502 | B1 | 7/2018 | Gopalan et al. |
| 10,236,044 | B2 | 3/2019 | Yoshida |
| 10,916,276 | B2 | 2/2021 | Yamamoto et al. |
| 11,868,648 | B2 * | 1/2024 | Yamamoto ............ G06F 3/0679 |
| 2008/0086589 | A1 | 4/2008 | Urabe |
| 2008/0086590 | A1 | 4/2008 | Urabe |
| 2012/0039138 | A1 * | 2/2012 | Ware .................... G11C 29/028 |
| | | | 365/194 |
| 2016/0239220 | A1 | 8/2016 | Yu et al. |
| 2017/0125092 | A1 | 5/2017 | Hirashima et al. |
| 2018/0233184 | A1 | 8/2018 | Choi |
| 2018/0277180 | A1 | 9/2018 | Yoshida |
| 2021/0174882 | A1 | 6/2021 | Hagiwara et al. |
| 2021/0226632 | A1 | 7/2021 | Matsuno et al. |

OTHER PUBLICATIONS

Notice of Allowance dated Sep. 1, 2023, issued in parent U.S. Appl. No. 17/575,749.
U.S. Appl. No. 17/202,590, First Named Inventor: Masato Dome; Title: "Semiconductor Memory Device"; filed Mar. 16, 2021.
U.S. Appl. No. 17/202,661, First Named Inventor: Junya Matsuno; Title: "Semiconductor Device"; filed Mar. 16, 2021.

* cited by examiner

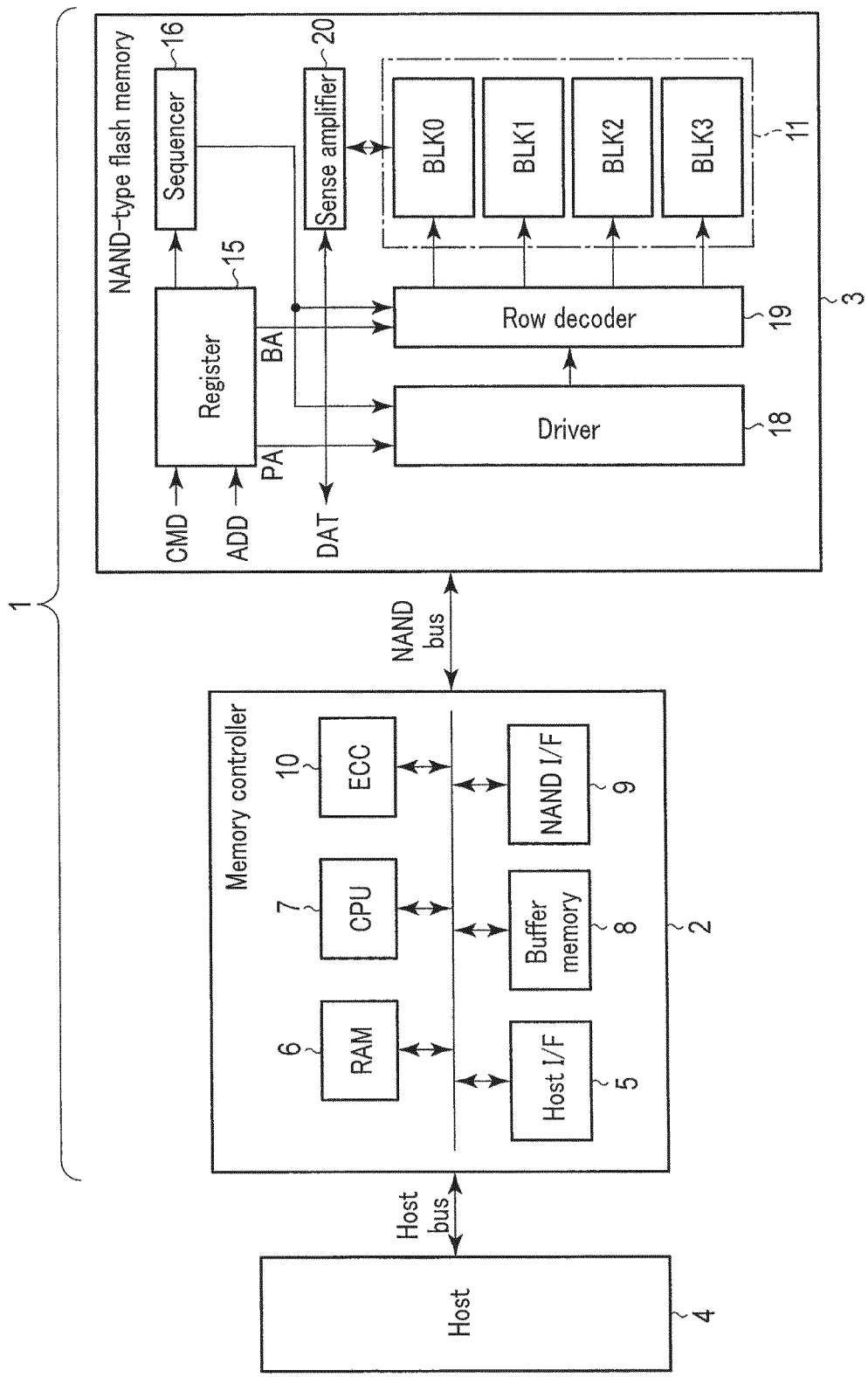
F I G. 1

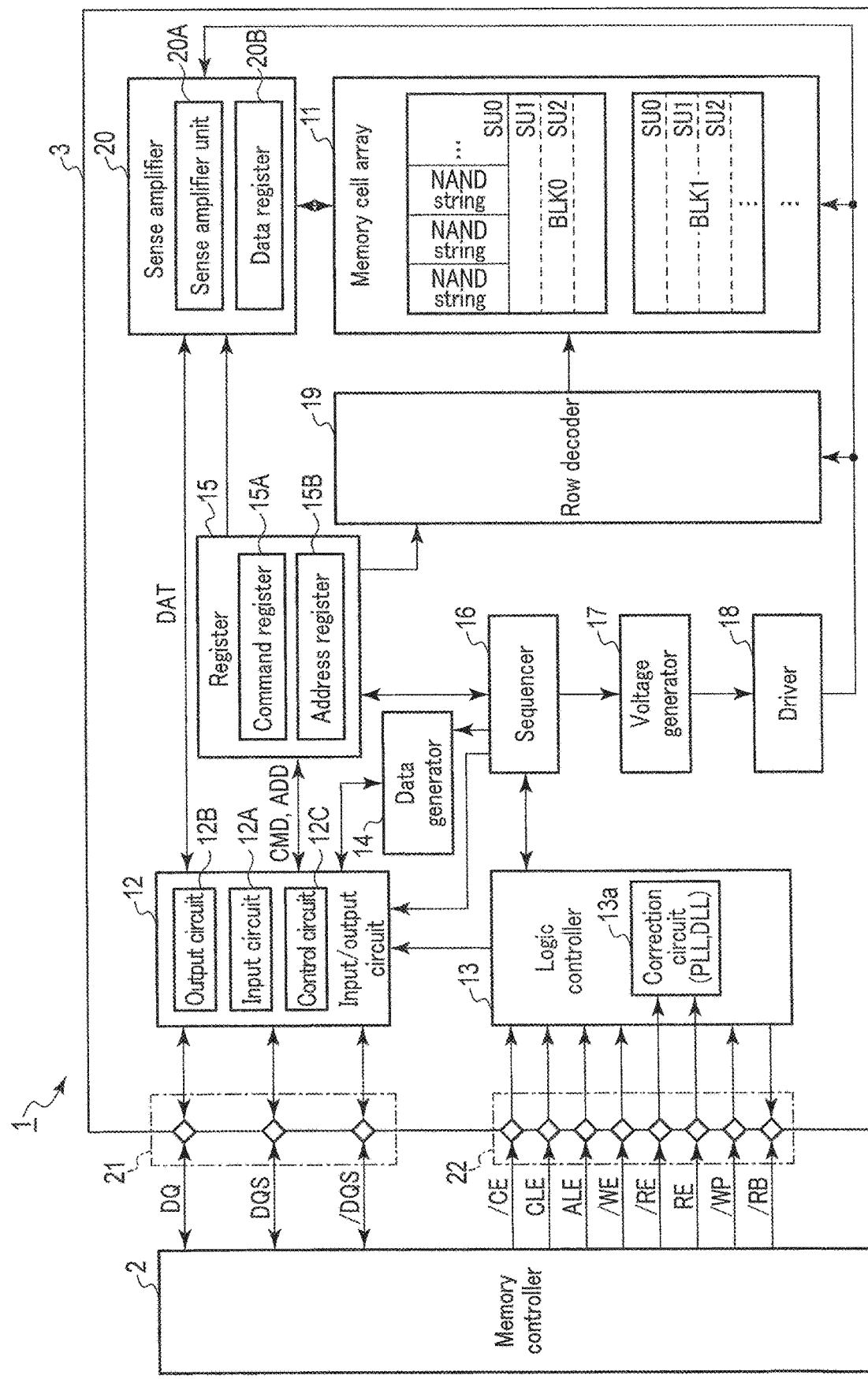
F I G. 2

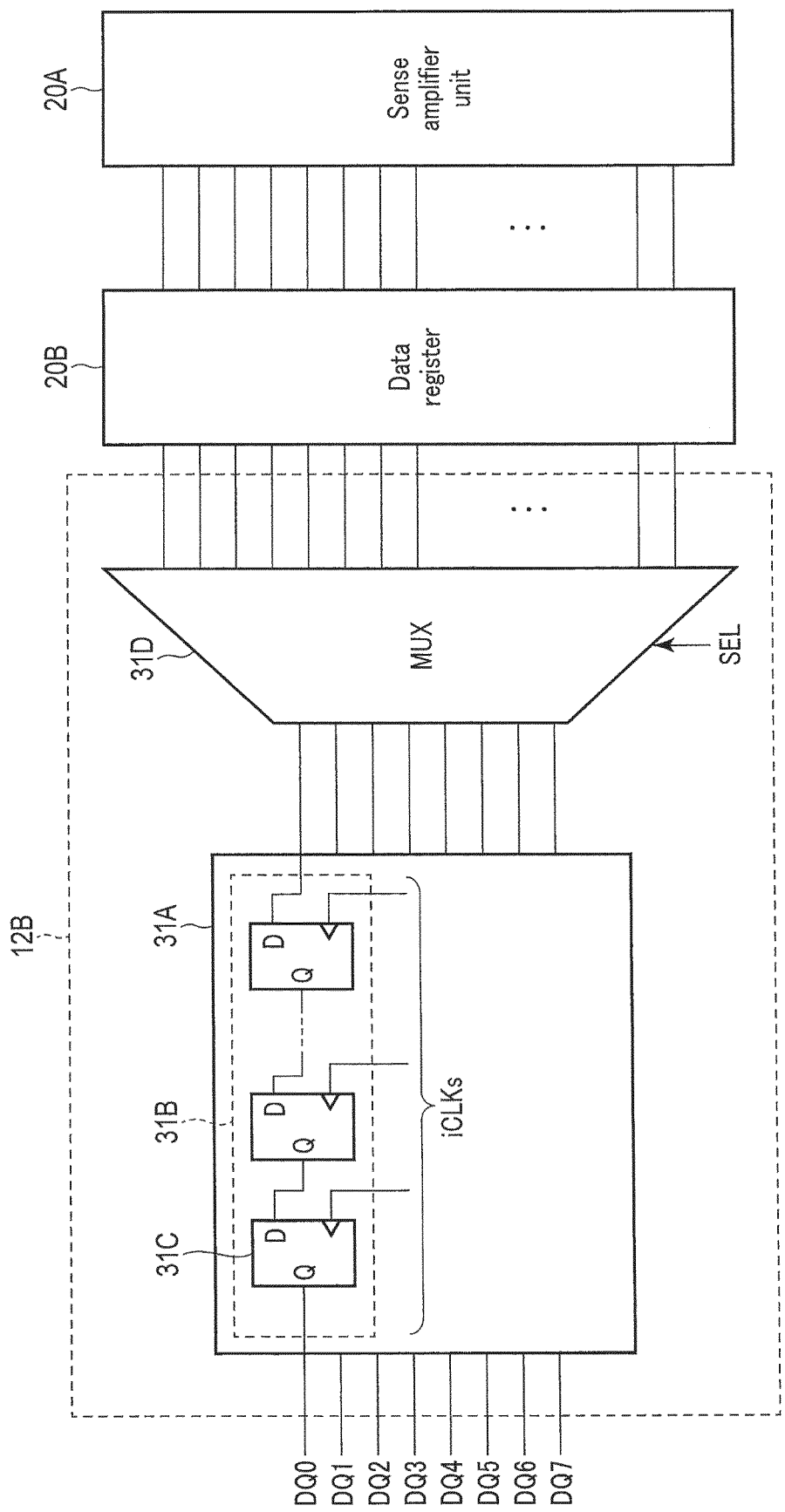
F I G. 4

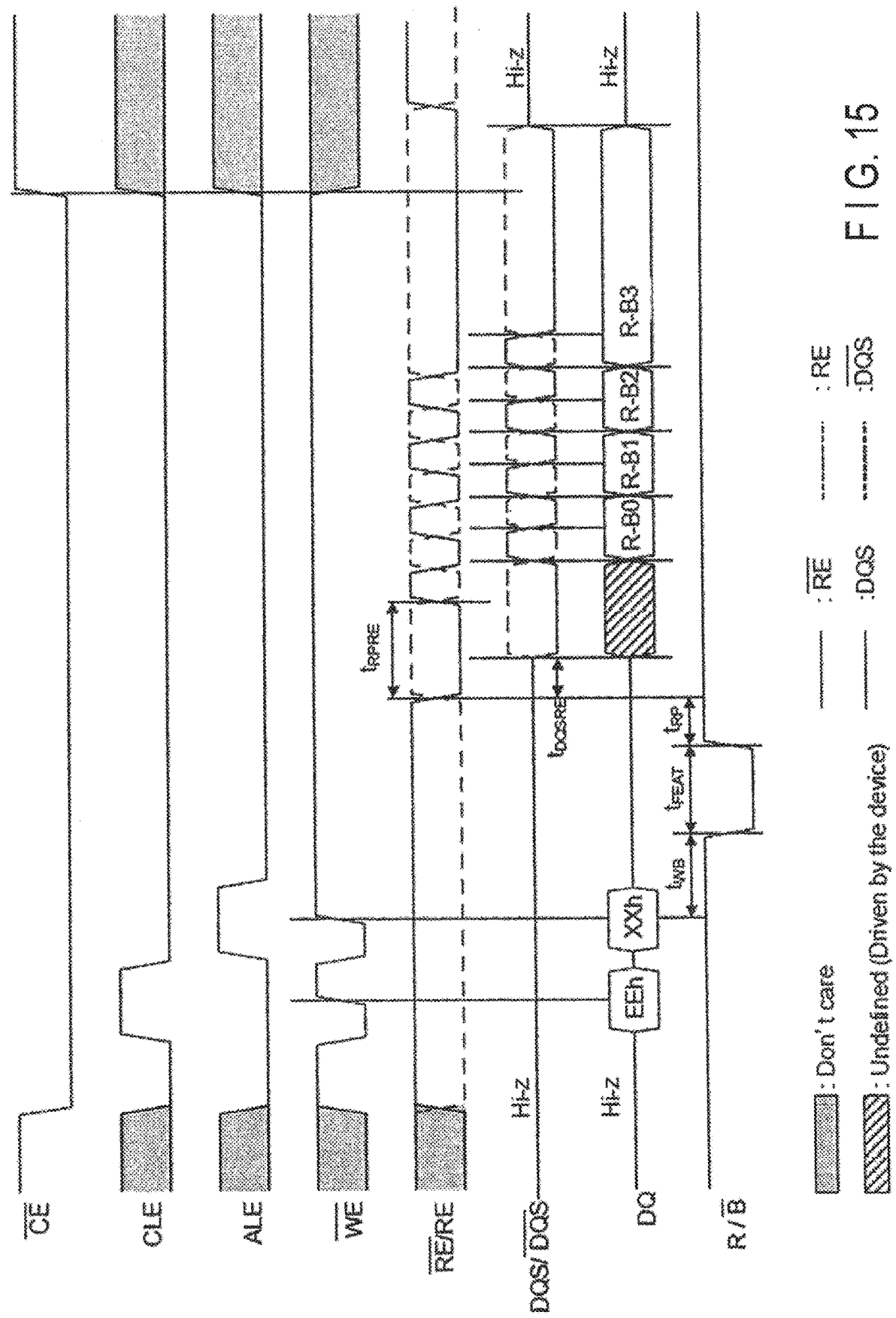
F I G. 15

MEMORY SYSTEM

CROSS-REFERENCE TO RELATED APPLICATIONS

This application is a Continuation Application of U.S. Application Ser. No. 17/575,749, filed Jan. 14, 2022, and issued as U.S. Pat. No. 11,868,648, on Jan. 9, 2024, which is a Continuation Application of PCT Application No. PCT/JP2019/036211, filed Sep. 13, 2019, the entire contents of all of which are incorporated herein by reference.

FIELD

Embodiments described herein relate generally to a memory system.

BACKGROUND

NAND flash memories are known as semiconductor memory devices.

BRIEF DESCRIPTION OF THE DRAWINGS

FIG. 1 is a block diagram conceptually showing an overall configuration of a memory system according to an embodiment.

FIG. 2 is a block diagram showing a configuration example of a NAND-type flash memory.

FIG. 4 is a block diagram showing a configuration example of an output circuit.

FIG. 15 is a timing chart showing timings of respective signals in a standby time and a delay time according to a fifth embodiment.

DETAILED DESCRIPTION

Figure 3:
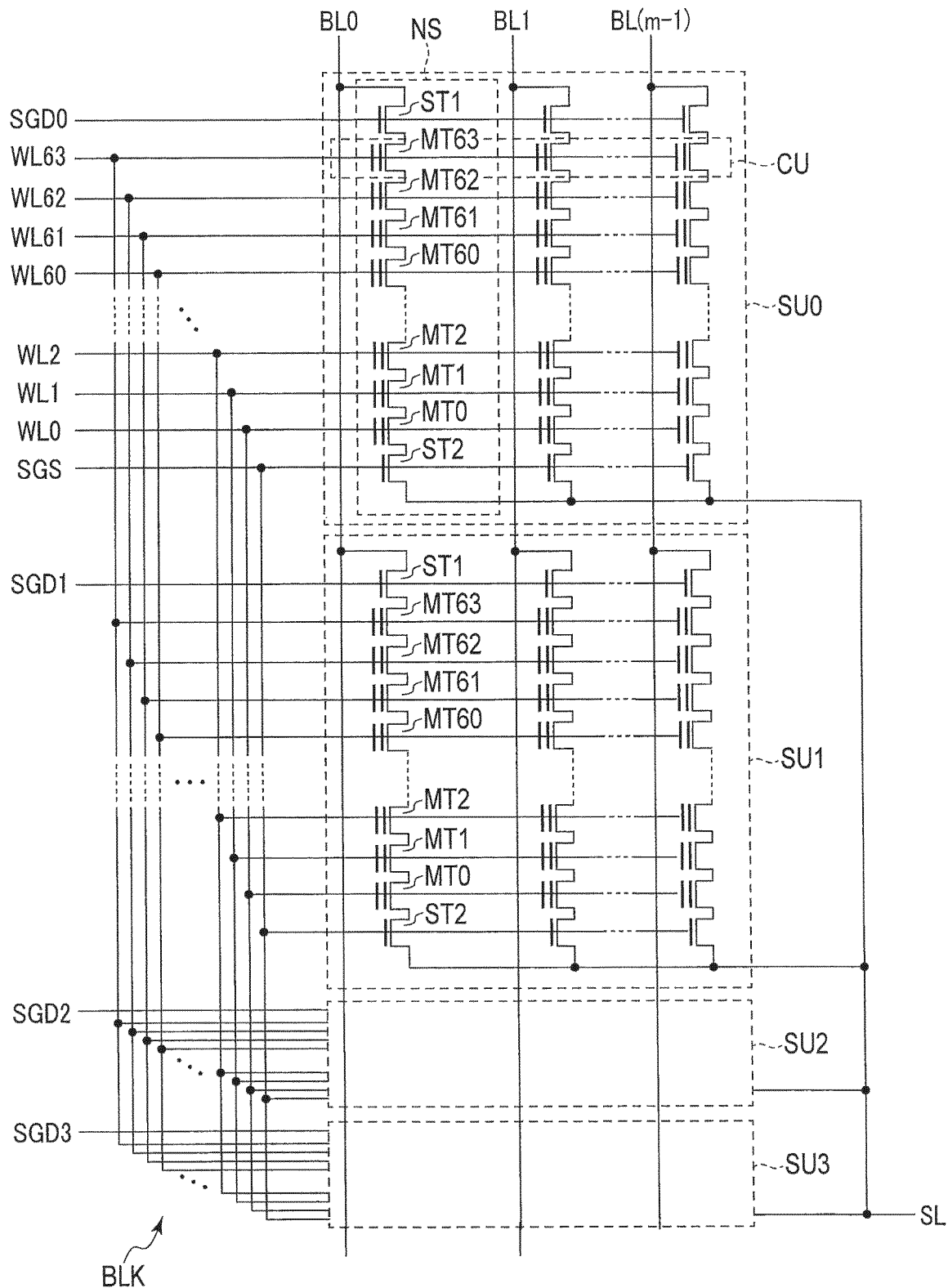
FIG. 3 is a circuit diagram showing a configuration example of a memory cell array of the NAND-type flash memory.

In general, according to one embodiment, a memory system includes a semiconductor memory, and a controller configured to provide an instruction to read data from the semiconductor memory, the semiconductor memory including, a memory cell transistor configured to store data, an output circuit configured to perform a process for data read from the memory cell transistor to be output to the controller, and a data generator configured to generate first data, wherein when the data is read, the controller outputs a first signal to the semiconductor memory within a first period in which the output circuit is performing the process, the semiconductor memory generates a second signal based on the first signal, and outputs the first data along with the second signal to the controller in the first period and a second period, and after the second period has lapsed, the semiconductor memory outputs the data read from the memory cell transistor along with the second signal to the controller.

Hereinafter, embodiments will be described with reference to the accompanying drawings.

The embodiments exemplify a device for embodying the technical idea of the invention. The drawings are schematic or conceptual, and the dimensions and scales of the drawings are not necessarily the same as those of the actual products. The technical ideas of the present invention are not limited by shapes, structures, or arrangements, etc. of components. In the following descriptions, components having similar functions and configurations will be denoted by the same symbols, and detailed descriptions thereof will be omitted.

First Embodiment

A memory system according to the first embodiment will be described.

<Overall Configuration of Memory System>

FIG. 1 is a configuration diagram conceptually showing an overall configuration of a memory system 1 according to the present embodiment.

The memory system 1 of the embodiment includes at least a semiconductor memory 3 and a memory controller (controller) 2 configured to control the semiconductor memory 3. In this embodiment, it suffices that the semiconductor memory 3 is a nonvolatile memory, preferably, for example, a NAND-type flash memory. In the following descriptions, an example is described in which a NAND-type flash memory 3 is used as a semiconductor memory device.

The memory controller 2 and the NAND-type flash memory 3 may be combined to form a single semiconductor device. As an example of such semiconductor devices, an SD™ card, a solid state drive (SSD), etc. are known. Furthermore, a system on chip (SoC) or the like can be used as the memory controller 2.

The NAND-type flash memory 3 includes a plurality of memory cell transistors to store data nonvolatilely. The memory controller 2 is coupled to the NAND-type flash memory 3 via a NAND bus. The memory controller 2 is further coupled to an external host device 4 via a host bus. The memory controller 2 controls the NAND-type flash memory 3, and accesses the NAND-type flash memory 3 in response to an order received from the host device 4. The host device 4 is, for example, a digital camera or a personal computer or the like, and the host bus is, for example, an SD™ interface-compatible bus. The NAND bus performs signal transmission/reception that is compatible with a NAND interface.

<Configuration of Memory Controller 2>

A detailed configuration of the memory controller 2 will be described with reference to FIG. 1.

The memory controller 2 controls the NAND-type flash memory 3. Specifically, the memory controller 2 performs control of writing data in the NAND-type flash memory 3 and reading stored data from the NAND-type flash memory 3.

The memory controller 2 includes a host interface circuit (host I/F) 5, a built-in memory (random access memory: RAM) 6, a processor (central processing unit: CPU) 7, a buffer memory 8, a NAND interface circuit (NAND I/F) 9, and an error checking and correcting (ECC) circuit 10. Furthermore, the memory controller includes other various component parts according to the design.

The host interface circuit 5 is coupled to the host device 4 via the host bus to transfer orders and data received from the host device 4 respectively to the processor 7 and the buffer memory 8. In response to an order from the processor 7, the host interface circuit 5 transfers the data in the buffer memory 8 to the host device 4.

The processor 7 controls the overall operation of the memory controller 2. For example, upon receipt of a data write order from the host device 4, the processor 7 issues, in response thereto, a write order to the NAND interface circuit 9. Similar processing is performed at the time of reading data and erasing data. The processor 7 also executes various processes, such as wear leveling, for managing the NAND-type flash memory 3. The operations of the memory controller 2 explained below may be implemented by execution of software (firmware) by the processor 7, or may be implemented by hardware.

The NAND interface circuit 9 is coupled to the NAND-type flash memory 3 via the NAND bus to communicate with the NAND-type flash memory 3. Based on an order received from the processor 7, the NAND interface circuit 9 transmits and receives various signals to and from the NAND-type flash memory 3. The buffer memory 8 temporarily stores write data and read data.

The built-in memory (RAM) 6 is, for example, a semiconductor memory such as a DRAM and a SRAM, and is used as a work area of the processor 7. The built-in memory 6 stores firmware, various management tables, and the like to manage the NAND-type flash memory 3.

The ECC circuit 10 performs error detection and error correction processes on data stored in the NAND-type flash memory 3. That is, the ECC circuit 10 generates an error correction code and appends it to write data at the time of data writing, and decodes the error correction code at the time of data reading.

<NAND Bus of NAND-Type Flash Memory>

The NAND bus will be described with reference to FIG. 2.

The memory controller 2 and the NAND-type flash memory 3 are coupled via the NAND bus. The NAND bus includes a plurality of signal lines, which are divided into a signal line group coupled to an input/output pad group 21 coupled to an input/output circuit 12, and a signal line group coupled to a logic control pad group 22 coupled to a logic controller 13.

These signal lines perform transmission and reception of a chip enable signal /CE, a command latch enable signal CLE, an address latch enable signal ALE, a write enable signal /WE, a read enable signal /RE, a write protect signal /WP, a ready/busy signal /RB, a data signal DQ, and data strobe signals DQS and /DQS, which are compatible with the NAND interface. The signals CLE, ALE, /WE, /RE, and /WP are received by the NAND-type flash memory 3. The signal /RB and the signal /CE are received by the NAND-type flash memory 3.

The chip enable signal /CE is a signal to enable the NAND-type flash memory 3. The command latch enable signal CLE allows a command CMD transmitted as the data signal DQ to be latched in a command register 15A of a register 15, which will be described later. The signal CLE notifies the NAND-type flash memory 3 that the signal DQ flowing through the NAND-type flash memory 3 while the signal CLE is at an "H (high)" level is the command CMD. The signal DQ is, for example, an 8-bit signal.

The address latch enable signal ALE allows an address ADD transmitted as the data signal DQ to be latched in an address register 15B of the register 15, which will be described later. The signal ALE notifies the NAND-type flash memory 3 that the signal DQ transmitted to the NAND-type flash memory 3 while the signal ALE is at the "H" level is the address ADD. The write enable signal /WE allows writing. The signal /WE instructs the NAND-type flash memory 3 to fetch the signal DQ transmitted to the NAND-type flash memory 3 while the signal /WE is at an "L (low) level.

The read enable signals RE and /RE instruct the NAND-type flash memory 3 to output the data signal DQ, and are used to control an operation timing of the NAND-type flash memory 3 when, for example, the signal DQ is output. The write protect signal /WP is a signal that instructs the NAND-type flash memory 3 to prohibit data writing and erasing. The ready/busy signal /RB indicates that the NAND-type flash memory 3 is in a ready state (to accept an instruction from outside) or a busy state (to not accept an instruction from outside).

The data signal DQ is, for example, an 8-bit signal. The signal DQ is an entity of data transmitted and received between the NAND-type flash memory 3 and the memory controller 2, and includes the command CMD, the address ADD, and data DAT. Bidirectional data strobe signals DQS and /DQS as reference signals are used to control an operation timing of, for example, the NAND-type flash memory 3 concerning the signal DQ.

<Configuration of NAND-Type Flash Memory>

Next, a configuration example of the NAND-type flash memory 3 will be described with reference to FIG. 2.

The NAND-type flash memory 3 includes a memory cell array 11, the input/output circuit 12, the logic controller 13, the register 15, a sequencer 16, a voltage generator 17, a driver 18, a row decoder 19, a sense amplifier 20, the input/output pad group 21, the logic control pad group 22, a data generator 14, etc.

The memory cell array 11 includes a plurality of blocks BLK (BLK0, BLK1, . . . ). The block BLK includes a plurality of nonvolatile memory cell transistors (not shown) associated with word lines and bit lines. The block BLK is, for example, an erasure unit of data, and the data in one block BLK can be erased collectively. Each block BLK includes a plurality of string units SU (SU0, SU1, . . . ). Each of the string units SU includes a plurality of NAND strings NS. Each of the number of blocks in the memory cell array 11, the number of string units US in one block BLK, and the number of NAND strings in one string unit SU can be set to any number.

<Configuration of Memory Cell Array>

Next, a configuration of the memory cell array of the NAND-type flash memory 3 will be described with reference to FIG. 3. FIG. 3 shows a circuit of a single block BLK in the memory cell array 11.

As shown in FIG. 3, each string unit SU is composed of a set of NAND strings NS. Each of the NAND string NS includes, for example, 64 memory cell transistors MT (MT0 through MT63), a select transistor ST1, and a select transistor ST2. The number of memory cell transistors MT included in a single NAND string NS is not limited to 64, but may be any number such as 8, 16, 96, etc. That is, the number of memory cell transistors MT is not limited to a specific value. The memory cell transistor MT includes a stacked gate including a control gate and a charge storage layer. The memory cell transistors MT are coupled in series between the select transistors ST1 and ST2. In the following description, the term "couple" is not limited to an electrical coupling in which elements are coupled to each other, but includes a case in which at least two elements are coupled with another conductive element, such as a wire (a metal wire or a polysilicon wire), interposed therebetween.

The gates of the select transistors ST1 of the string units SU0 through SU3 of any one of the blocks BLK are coupled to select gate lines SGD0 through SGD3, respectively. The gates of the select transistors ST2 of all string units SU in the block BLK are coupled in common to the select gate line SGS. The control gates of the memory cell transistors MT0 through MT7 in the same block BLK are respectively coupled to the word lines WL0 through WL7. Thus, the word line WL of the same address is coupled in common to all string units SU in the same block BLK, and the select gate line SGS is coupled in common to all string units SU in the same block BLK. On the other hand, the select gate line SGD is coupled to only one of the string units SU in the same block BLK.

Of the NAND strings NS arranged in the matrix pattern in the memory cell array 11, the end of the select transistor ST1 of the NAND strings NS of the same row not coupled to the memory cell transistor is coupled to any one of m bit lines BL (BL0 through BL(m−1), where m is a natural number). The bit line BL is coupled in common to the NAND strings NS of the same column in a plurality of blocks BLK.

The end of the select transistor ST2 not coupled to the memory cell transistor is coupled to a source line SL. The source line SL is coupled in common to the NAND strings NS in the blocks BLK.

As described above, data erasure is, for example, performed collectively for the memory cell transistors MT in the same block BLK. In contrast, a data read operation or a data write operation can be performed collectively for a plurality of memory cell transistors MT which are coupled in common to a given word line WL of a given string unit SU of a given block BLK. The set of the memory cell transistors MT as described above, which are coupled in common to a word line WL in a string unit SU, is called, for example, a cell unit CU. In other words, the cell unit CU is a set of memory cell transistors MT to which the write operation or read operation can be performed collectively.

One memory cell transistor MT can store, for example, a plurality of pieces of bit data. In the same cell unit CU, a set of 1-bit data, which the memory cell transistors MT store in the same bit, is referred to as a "page". In other words, the page can be defined as a part of a memory space formed in a set of memory cell transistors MT in the same cell unit CU. 1 page corresponds to, for example, 128 Kbit (16 KByte).

Referring back to FIG. 2, a further description will be given. The input/output circuit 12 includes at least an input circuit 12A, an output circuit 12B, and a control circuit 12C. The input/output circuit 12 transmits and receives the data signal DQ to and from the memory controller 2. The input/output circuit 12 respectively transfers the command CMD and the address ADD included in the signal DQ input to the input/output pad group 21 to the command register 15A and the address register 15B of the register 15. Furthermore, the input/output circuit 12 transfers write data DAT included in the signal DQ input to the input/output pad group 21 to a data register 20B of the sense amplifier 20, and transfers read data DAT transferred from the data register 20B of the sense amplifier 20 to the input/output pad group 21.

FIG. 4 is a circuit diagram of the output circuit 12B. As shown, the output circuit 12B includes a shift register unit 31A and a multiplexer (MUX) 31D [selection circuit]. The shift register unit 31A includes a shift register 31B [hold circuit] composed of a plurality of flip-flops 31C coupled in series. The shift register 31B is located at each of the signal lines DQ0 to DQ7, and temporarily stores data therein. The number of the flip-flops 31C is determined appropriately in accordance with the timing control of the signal DQ; in this example, the number is 8.

One of the input terminals of the multiplexer 31D is coupled to an input terminal D of the first-stage flip-flop 31C (the rightmost stage in FIG. 4), and an output terminal Q is coupled to an input terminal D of the next-stage flip-flop 31C. An output terminal Q of the next-stage flip-flop 31C is coupled to an input terminal D of the next next-stage flip-flop 31C.

The coupling of the flip-flops is repeated in this manner. An output terminal Q of the last-stage flip-flop 31C is coupled to one of the signal lines DQ0 through DQ7 (the signal line DQ0 in the example of FIG. 4). Internal clocks iCLK that are, for example, different in cycle are input to clock terminals of the respective flip-flops 31C from the sequencer 16. Each flip-flop 31C latches data input at a timing when the internal clock iCLK input to the clock terminal rises.

The multiplexer 31D selects, for example, 8-bit data from the read data DAT of one page (16 KByte) read from the memory cell 11 to a sense amplifier unit 20A and stored in the data register 20B, and transfers the 8-bit data to the shift register unit 31A. The transferred 8-bit data is successively transferred while being held by the flip-flop 31C functioning as a buffer. For example, the read data is temporarily stored by the shift register 31B, and thereafter, when the memory controller 2 toggles the read enable signals RE and /RE, the read data stored by the shift register 31B is output in units of 8 bits from the output terminal Q of the last-stage flip-flop 31C as the data DQ. Thus, the 16-KByte parallel data is converted to 8-bit serial data by the output circuit 12B.

Referring back to FIG. 2 again, a further description will be given. The logic controller 13 receives the signals /CE, CLE, ALE, /WE, /RE, and /WP from the memory controller 2. The logic controller 13 transfers the signal /RB to the memory controller 2, and notifies the memory controller 2 whether the NAND-type flash memory 3 is in a ready state or in a busy state.

The logic controller 13 includes a correction circuit 13a including a phase-locked loop (PLL) circuit or a delay-locked loop (DLL) circuit. The correction circuit 13a has a function of correcting a duty ratio of the input signals RE and /RE respectively input via the pads in the logic control pad group. The correction circuit 13a corrects the duty ratio of the signals RE and /RE based on the control signal from the sequencer 16, and generates the corrected signals RE and /RE. The corrected signals RE and /RE are sent out to, for example, the input/output circuit 12. The input/output circuit 12 toggles the signals DQS and /DQS at timings corresponding to the corrected signals RE and /RE.

The register 15 includes the command register 15A configured to store the command CMD and the address register 15B configured to store the address ADD. The register 15 transfers the address ADD to the row decoder 19 and the sense amplifier 20, and transfers the command CMD to the sequencer 16.

The sequencer 16 receives the command CMD, and controls the whole of the NAND-type flash memory 3 in accordance with the sequence based on the received command CMD. The sequencer 16 also sends out temperature information received from a temperature sensor or the like to the memory controller 2 via the input/output circuit 12.

The voltage generator 17 generates voltages necessary for operations of data writing, reading, erasure, etc. based on instructions from the sequencer 16. The voltage generator 17 supplies the generated voltages to a driver (driver set) 18.

The driver 18 supplies various voltages from the voltage generator 17 to the row decoder 19 and the sense amplifier 20 based on the address ADD transferred from the address register 15B of the register 15. The driver 18 supplies various voltages to the row decoder 19 based on, for example, a row address in the address.

The row decoder 19 receives the row address included in the address ADD transferred from the address register 15B of the register 15, and selects a memory cell transistor of a row based on the row address. A voltage from the driver 18 is transferred to the memory cell transistor in the selected row via the row decoder 19.

The sense amplifier 20 includes the sense amplifier unit 20A and the data register 20B. When reading data, for example, the sense amplifier unit 20A reads (senses) the data DAT read from the memory cell transistor to a bit line, and transfers the sensed read data DAT to the data register 20B. The read data DAT stored in the data register 20B is transferred to the output circuit 12B. When writing data, for example, the write data DAT transferred to the data register 20B from the input circuit 12A is written into the memory cell transistor via the bit line by the sense amplifier unit 20A. The sense amplifier 20 receives a column address included in the address ADD from the address register 15B of the resistor 15, and outputs data of a column based on the column address.

For example, in accordance with the read command supplied from the memory controller 2, the sense amplifier unit 20A reads data from the memory cell transistor and transfers it to the data register 20B, and in accordance with a data out command supplied from the memory controller 2, the sense amplifier unit 20A transfers the data stored in the data register 20B to the output circuit 12B.

The period from the time when the read command is supplied from the memory controller 2 to the time when the sense amplifier 20A reads data from the memory cell array 11 and the read data is stored in the data register 20B is referred to as a "period tR". During the period tR, the ready/busy signal R/Bn and an internal busy signal are both in an "L" level (ready state).

The input/output pad group 21 transfers the data signals DQ, DQS, and /DQS received from the memory controller 2 to the input/output circuit 12. The input/output pad group 21 also transfers the signal DQ transmitted from the input/output circuit 12 to an outside of the NAND-type flash memory 3.

The logic control pad group 22 transfers the signals /CE, CLE, ALE, /WE, /RE, and /WP received from the memory controller 2 to the logic controller 13. The logic control pad group 22 also transfers the signal /RB transmitted from the logic controller 13 to an outside of the NAND-type flash memory 3.

The data generator 14 outputs dummy data from the output circuit 12B in accordance with the signals DQS and /DQS, for example, based on instructions from the sequencer 16. Specifically, the memory controller 2 toggles the read enable signals RE and /RE, and the NAND-type flash memory 3 generates the signals DQS and /DQS upon receipt of the signals RE and /RE. The data generator 14, upon receipt of the signals DQS and /DQS, generates preset dummy data and outputs it to the memory controller 2 from the output circuit 12B. When the memory controller 2 determines that the received data is dummy data, it processes nothing or processes it as invalid data.

The dummy data may have, for example, a random pattern. Alternatively, the dummy data may have a pattern in which the respective signals at the signal lines DQ0 to DQ7 repeat toggling between the "H" level and the "L" level, such as 55h-AAh-55h-AAh . . . , or may have a data pattern of fixed values. The data generator 14 may be included in the logic controller 13 or the input/output circuit 12. For example, the control circuit 12C of the input/output circuit 12 may have a function of the data generator 14.

Figure 6A:
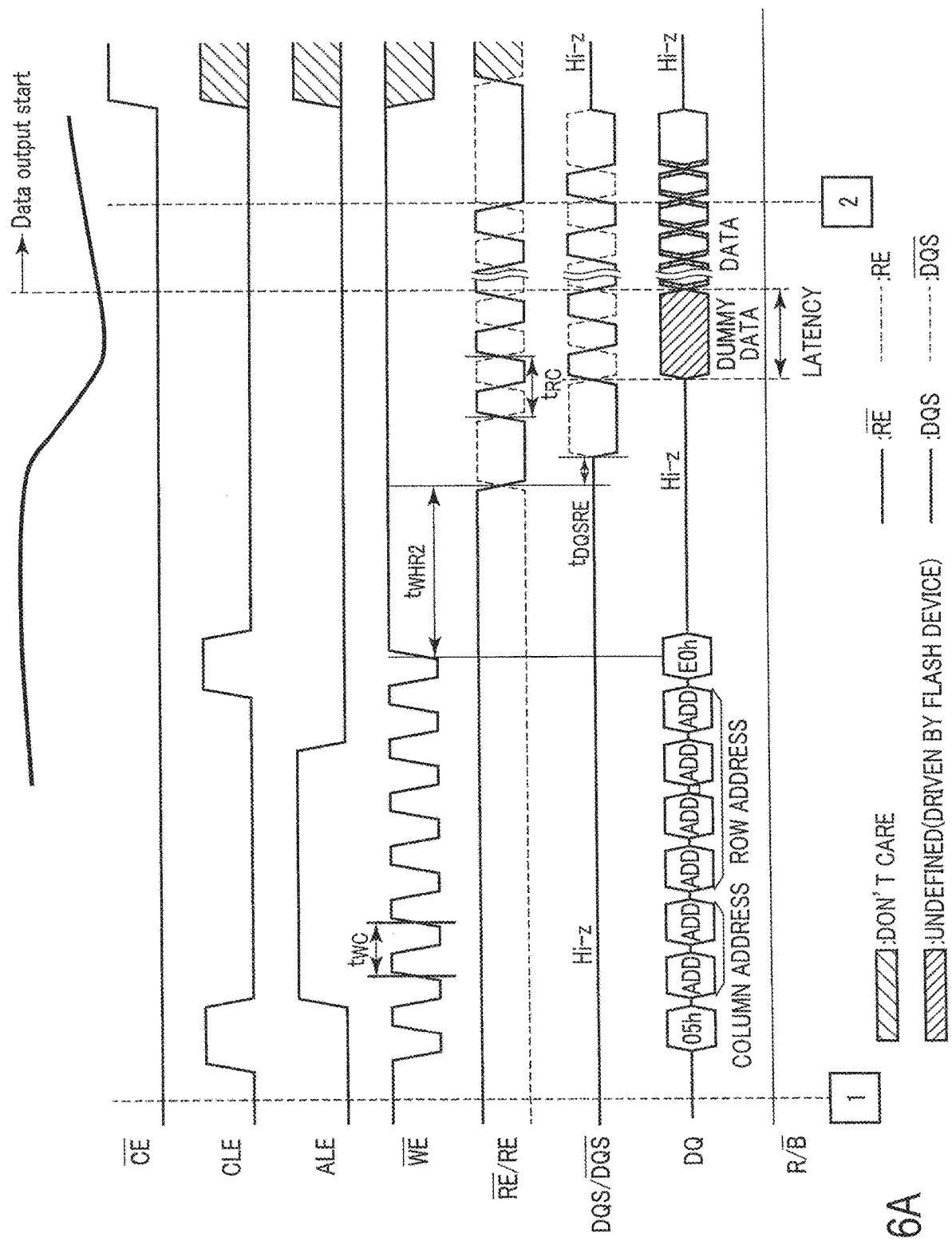
FIG. 6A is a timing chart for explaining a data output operation according to the comparative example in comparison with the embodiment.
Figure 6B:
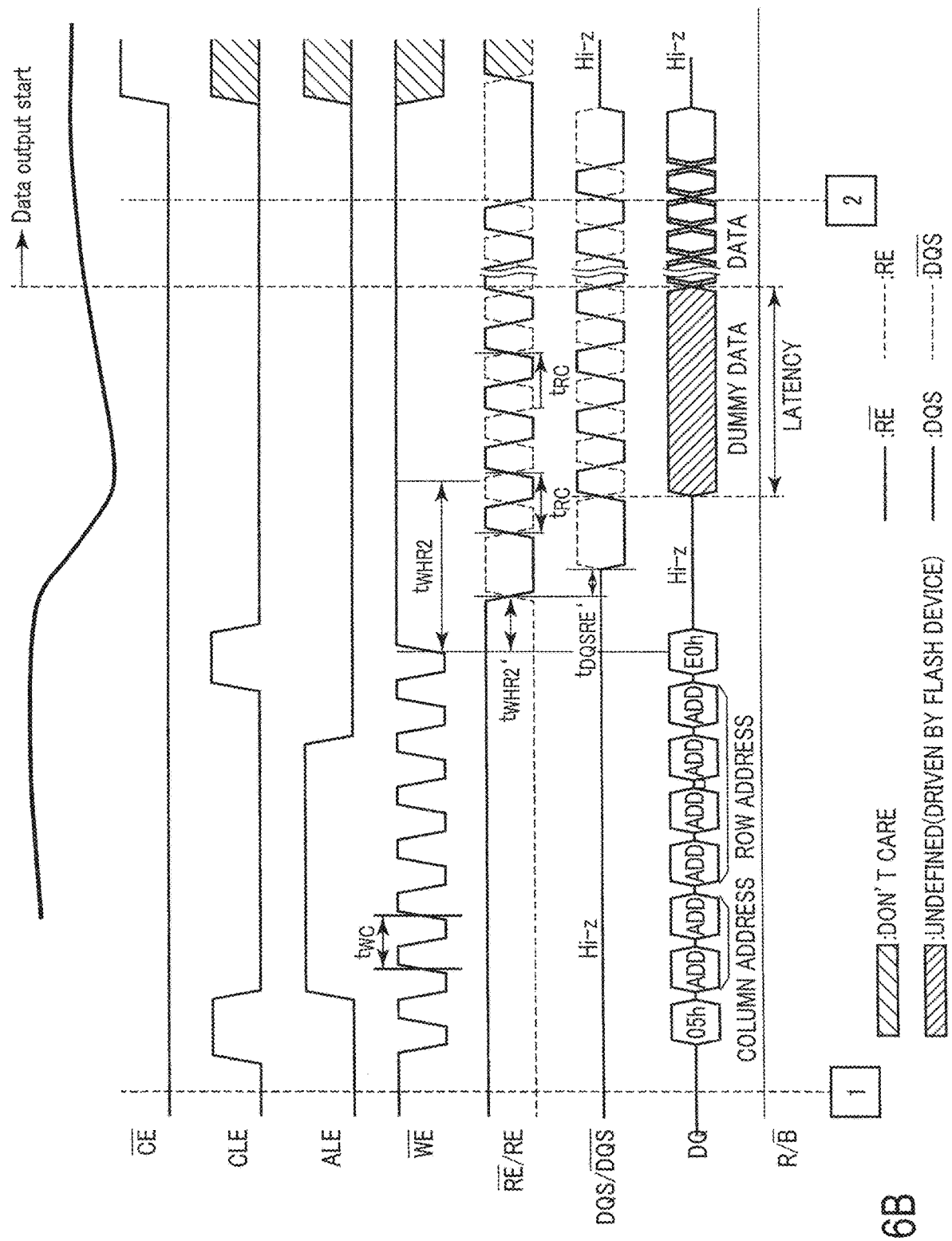
FIG. 6B is a timing chart for explaining stabilization of a power output in a data output operation according to a first embodiment.

Next, stabilization of an operation for outputting data from the NAND-type flash memory 3 to the memory controller 2 utilizing the dummy data output by the data generator 14 of this embodiment will be described with reference to FIGS. 1 to 4 and 6. FIG. 4 shows a configuration example of the output circuit 12B. FIG. 6A is a timing chart of data reading according to the comparative example, and FIG. 6B is a timing chart of data reading according to the present embodiment.

FIG. 6A shows a standby time $t_{WHR2}$ and a delay time (latency) set in the NAND-type flash memory 3 in the comparative example. The NAND-type flash memory 3 of the comparative example and the NAND-type flash memory 3 of the present embodiment have a similar circuit configuration, but are different in operation relating to the standby time $t_{WHR2}$ and the delay time.

For example, when the memory controller 2 issues a read command to the NAND-type flash memory 3, the sense amplifier unit 20A of the sense amplifier 20 reads data of 1 page (for example, 16 KByte) from the memory cell array 11, and the data register 20B stores the read data. Next, for example, the memory controller 2 issues a data out command to the NAND-type flash memory 3. The data out command is a command set composed of one or more command signals ("05h" and "E0h") supplied as an 8-bit signal DQ and one or more address signals (column addresses ADD and row addresses ADD) supplied as an 8-bit signal DQ.

When the memory controller 2 issues the data out command to the NAND-type flash memory 3, the data of 1 page is transferred from the data register 20B to the output circuit 12B, as shown in FIG. 4. The multiplexer 31D of the output circuit 12B successively selects and transfers 8-bit data from the transferred 16 KByte data to the shift register unit 31A. The shift register unit 31A stores and transfers the 8-bit data with the flip-flop 31C functioning as a buffer. Accordingly, the read data is temporarily stored in the shift register 31B. In this state, when the signals RE and /RE are toggled, the 8-bit DQ data is output from the output terminal Q of the last-stage flip-flop 31C to the memory controller 2 via the input/output pad group 21.

The standby time $t_{WHR2}$ [first period] is, for example, a period of time required from the time when the memory controller 2 issues the data out command to the NAND-type flash memory 3 to the time when the read data of 16 KByte read from the memory cell array 11 is transferred from the data register 20B to the output circuit 12B and a preparation for outputting the first 8 bits as DQ data to the memory controller 2 is completed in the output circuit 12B. Therefore, for example, the first 8 bits of the data in the data register 20B are transferred to the last-stage flip-flop 31C in the shift register unit 31A of the output circuit 12B during the standby time $t_{WHR2}$, and after a lapse of the standby time $t_{WHR2}$, the memory controller 2 starts toggling the signals RE and /RE, so that an output of 8-bit DQ data to the signal lines DQ0 to DQ7 is started. If the memory controller 2 starts toggling the signals RE and /RE before the lapse of the standby time $t_{WHR2}$, incomplete data may be output when storage of the 8-bit data into an output buffer (not shown) coupled to the signal lines DQ0 to DQ7 has not completed, or unintended data may be output.

Thus, in the comparative example, the memory controller 2 cannot toggle the signals RE and /RE for instructing the NAND-type flash memory 3 to output data, until the data out command is issued to the NAND-type flash memory 3 and the standby time $t_{WHR2}$ lapses.

Furthermore, as shown in FIG. 6A, in the comparative example, a delay time (latency) [second period] is further added after the lapse of the standby time $t_{WHR2}$ [first period].

After the memory controller 2 starts toggling the signals RE and /RE, it also starts toggling the signals DQS and /DQS transmitted from the NAND-type flash memory 3 with a delay of a period of time $t_{DQSRE}$. For example, the correction circuit 13a of the logic controller 13 corrects the duty ratio of the signals RE and /RE input from the memory controller 2 via the logic control pad group 22, and the input/output circuit 12 generates the signals DQS and /DQS based on the corrected signals RE and /RE.

The signals DQS and /DQS are used, for example, to control operation timings of the NAND-type flash memory 3 concerning the signal DQ. Therefore, the NAND-type flash memory 3 can start outputting effective data immediately after the toggling of the signals DQS and /DQS has started.

However, immediately after the memory controller 2 starts toggling of the signals RE and /RE, a power supply VDD of the NAND-type flash memory 3 may be unstable. Therefore, the aforementioned latency is set to withhold outputting effective data until the power supply VDD that became unstable due to the start of toggling of the signals RE and /RE is stabilized. The timing when the output of effective data starts lags behind the timing when the toggling of the signals DQS and /DQS starts due to the latency.

It is preferable that the latency be long to stabilize the power supply VDD, but be short to increase the operation speed. The latency may be set to ensure a time for a correction process by the phase lock loop (PLL) or the delay lock loop (DLL) provided in the correction circuit (DCC) 13a, such as a duty ratio correction or a timing correction.

For example, the sequencer 16 counts one of the signals RE and /RE or one of the signals DQS and /DQS. After the count reaches a predetermined number, the sequencer 16 begins outputting data (effective data) that has been transferred from the data register 20B to the output circuit 12B.

Figure 5:
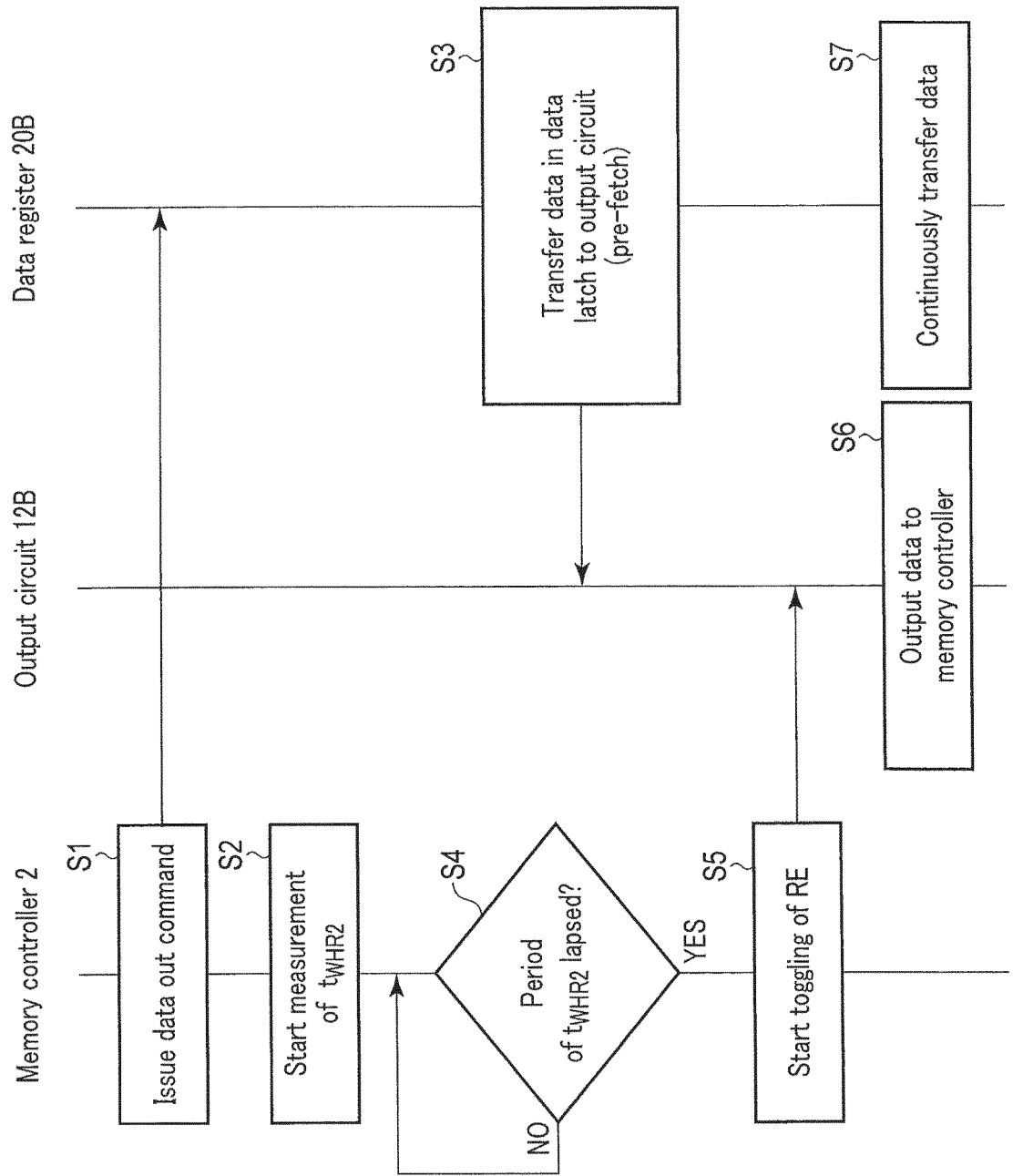
FIG. 5 is a flowchart of a comparative example in comparison with the embodiment.

FIG. 5 is a flowchart showing a data output in the comparative example.

First, in the comparative example, it is assumed that the sense amplifier unit 20A of the sense amplifier 20 reads data, for example, 1 page data of 16 KByte, from the memory cell array 11 based on the read command issued beforehand from the memory controller 2, and that the data register 20B stores the read data. In this state, while toggling the signal /WE, the memory controller 2 issues the data out command via the data signal lines DQ0 through DQ7 (step S1). The command is output to the sense amplifier 20, and a preset time measurement is started when the toggling of the signal /WE is stopped (step S2). In parallel with these steps, in the NAND-type flash memory 3, read data is transferred from the data register 20B to the multiplexer 31D in the output circuit 12B. During the standby time $t_{WHR2}$, the multiplexer 32D selects, for example, 16 KByte data in units of 8 bits and transfers it to the shift register unit 31A. During the standby time $t_{WHR2}$ (step S4: NO), it is not ensured that the output circuit 12B has completed preparation for outputting data to the memory controller 2. Therefore, the memory controller 2 does not start toggling the read enable signals RE and /RE during the standby time $t_{WHR2}$.

Then, when the period of the standby time $t_{WHR2}$ has lapsed (step S4: YES), the output circuit 12B is ready to output data to the memory controller 2. Accordingly, the memory controller 2 starts toggling the read enable signals RE and /RE (step S5). Upon receipt of the toggled signals RE and /RE, the NAND-type flash memory 3 starts toggling the signals DQS and /DQS. Upon receipt of the toggled signals DQS and /DQS, the data generator 14 causes the preset dummy data to be output from the output circuit 12B.

The output circuit 12B outputs dummy data, which is invalid, to the signal lines DQ0 through DQ7, for example, during the preset latency. After the lapse of the preset latency, the output circuit 12B outputs the data stored in the shift register unit 31A to the signal lines DQ0 through DQ7 (step S6). In cooperation with this output, data can be continuously transferred from the data register 20B to the multiplexer 31D of the output circuit 12B (step S7). Furthermore, the data is output from the output circuit 12B to the memory controller 2.

In the comparative example, the period from the time when the memory controller 2 issues the data out command to the time when the first effective 8-bit data is output from the NAND-type flash memory 3 includes at least the standby time $t_{WHR2}$ necessary for the internal data transfer process in the NAND-type flash memory 3 and the latency necessary to wait for stabilization of the power supply VDD that became unstable in accordance with the toggling of the signals RE and /RE. For example, if the latency is short, the data output may be started before the power supply VDD is stabilized, in which case the level of the output data may be unstable.

Figure 7:
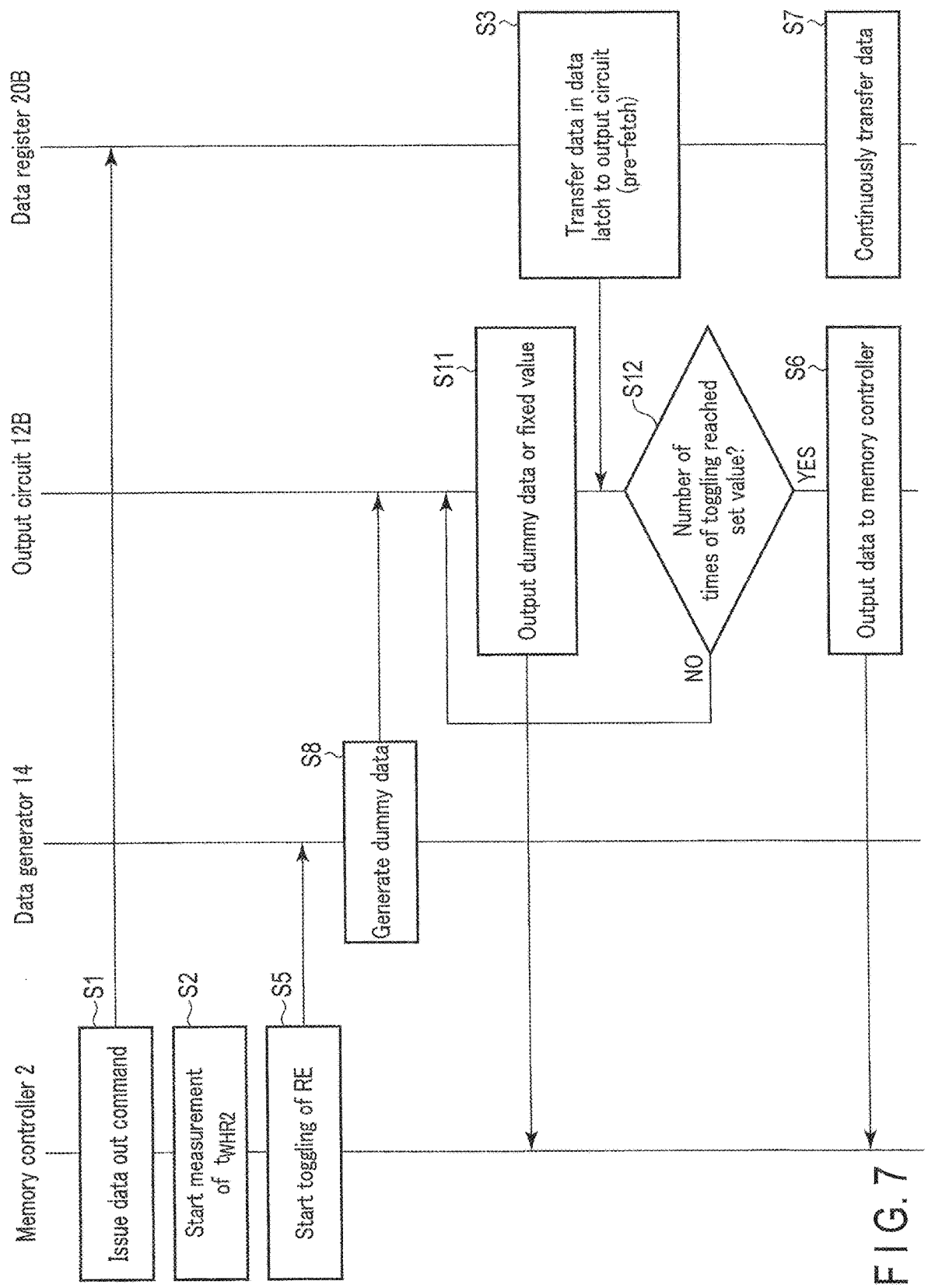
FIG. 7 is a flowchart for explaining stabilization of a power output in the data output operation according to the first embodiment.

Next, data output by the data generator 14 in the first embodiment will be described with reference to the timing chart shown in FIG. 6B and the flowchart shown in FIG. 7. The operations that are the same as those shown in the timing chart of FIG. 6A and the flowchart of FIG. 5 are assigned the same step numbers, and explanations thereof may be simplified.

In the present embodiment, the memory controller 2 starts toggling the signals RE and /RE after a lapse of a standby time $t_{WHR2}'$ shorter than the standby time $t_{WHR2}$ necessary for the internal data transfer process in the NAND-type flash memory 3. In the NAND-type flash memory 3, the input/output circuit 12 generates the signals DQS and /DQS based on the signals RE and /RE received from the memory controller 2, and outputs the generated signals DQS and /DQS to the output circuit 12B, and the data generator 14 generates dummy data based on the signals DQS and /DQS and outputs the generated dummy data to the output circuit 12B. The output circuit 12B outputs the dummy data to the memory controller 2 during the latency. The memory controller 2 does nothing with respect to the received dummy data. Thus, the output of the power supply can be stabilized. The dummy data is not particularly limited to a specific pattern; for example, it may have a random pattern or a preset data pattern.

Also in the explanations for a data output operation of this embodiment, it is assumed that the memory controller 2 issues the read command beforehand, and desired data is read from the memory cell array 11 and stored in the data register 20B.

First, the memory controller 2 issues the data out command to the NAND-type flash memory 3 (step S1). The data out command is a command set supplied as an 8-bit signal DQ including a first command signal "05h", column address signals ADD, row address signals ADD, and a second command signal "E0h". The memory controller 2 toggles the signal /WE at a cycle of time $t_{WC}$ in accordance with the issuance of the data out command.

Next, the memory controller 2 issues the data out command and starts a time measurement (step S2). Then, the memory controller 2 starts toggling the signals RE and /RE at the cycle of time $t_{RC}$ within the period of the standby time $t_{WHR2}$, namely after a lapse of the standby time $t_{WHR2}'$ shorter than the standby time $t_{WHR2}$ (step S5). The number of times of toggling the signals RE and /RE within the period of the standby time $t_{WHR2}$ and the toggle start timing can be set suitably depending on, for example, a set feature.

In parallel with these steps, when the NAND-type flash memory 3 receives the data out command, the data register 20B transfers the data of, for example, 16 KByte stored therein to the multiplexer 31D in the input/output circuit 12 (step S3). The multiplexer 31D transfers, for example, 16 KByte data in units of 8 bits to the respective shift registers 31B of the shift register unit 31A.

After the toggling of the signals RE and /RE is started, toggling of the signals DQS and /DQS is also started in the NAND-type flash memory 3 with a delay of a period of time $t_{DQSRE}'$. After the toggling of the signals DQS and /DQS is started, the data generator 14 generates dummy data and outputs the generated dummy data to the output circuit 12B (step S8). The output circuit 12B outputs the dummy data together with the signals DQS and /DQS to the memory controller 2 during the preset latency (step S11). The embodiment shown in FIG. 6B is a case in which an output of the dummy data starts at the same timing when the toggling of the signals DQS and /DQS starts. However, these timings are not limited as in the embodiment. As described, the memory controller 2 processes nothing for the dummy data. Furthermore, the output of the power supply VDD is more stable at the timing when an output of effective data, not dummy data, is started, as the toggling of the signals RE and /RE is started at an earlier timing.

Then, for example, when the number of times of toggling the signal DQS reaches a set value (step S12: YES), the data signal DQ read from the shift register unit 31A of the output circuit 12B is output to the memory controller 2 (step S6). In cooperation with this output, data can be continuously transferred from the data register 20B to the multiplexer 31D of the output circuit 12B (step S7). Furthermore, the data is output from the output circuit 12B to the memory controller 2. The output time or the number of cycles (the number of times of toggling) of the dummy data in the signal DQ is suitably set and is not particularly limited.

In the comparative example shown in FIG. 6A, after the standby time $t_{WHR2}$ has lapsed, the toggling of the signals RE and /RE is started and subsequently the toggling of the signals DQS and /DQS is started. The timing when the output of effective data is started lags behind the timing when the toggling of the signals DQS and /DQS is started due to the latency. In the case where the power supply VDD becomes unstable due to the start of toggling the signals RE and /RE, output of effective data can be started after the power supply VDD is stabilized by setting a long latency. In the comparative example, the period from the time when the memory controller 2 issues the data out command to the time when the first effective 8-bit data is output from the NAND-type flash memory 3 is at least longer than the sum of the standby time $t_{WHR2}$ and the latency.

In contrast, according to the present embodiment, during the standby time $t_{WHR2}$ [first period] shown in FIG. 6B, the toggling of the signals RE and /RE [first signals] is started, and subsequently the toggling of the signals DQS and /DQS [second signals] is started. After the period of toggling of the signals DQS and /DQS of an optional number of times has lapsed, the data generator 14 generates the dummy data [first data] and outputs it from the output circuit 12B to the memory controller 2. The memory controller 2 does not treat the dummy data as effective data (which has been read from the memory cell array 11 and stored in the data register 20B), and does not perform data processing. The memory controller 2 can determine whether data is the dummy data or not based on, for example, the number of times of toggling the signal DQS. If the dummy data has a pattern in which toggling is repeated, such as 55h-AAh-55h-AAh . . . , whether data is the dummy data or not may be determined based on the number of times of toggling in the dummy data instead of the number of times of toggling the signal DQS.

As described above, in the present embodiment, during the standby time $t_{WHR2}$, the toggling of the signals RE and /RE and the toggling of the signals DQS and /DQS are continuously started, and subsequently, the dummy data is output, so that the standby time $t_{WHR2}$ and the latency can be temporally overlapped. Thus, the output of the power supply VDD can be stabilized earlier than in the comparative example. Therefore, if the timing of starting the output of effective data is set at the same timing as in the comparative example illustrated in FIG. 6A, the latency required to stabilize the output of the power supply can be set longer. Accordingly, the output of effective data can be started after the output of the power supply VDD has been stabilized, for example, as shown in FIG. 6B, thereby improving the reliability of reading the data.

Otherwise, if there is no problem in reliability of reading the data as long as the output of the power supply VDD is stabilized to a level equivalent to that in the case of the comparative example, the toggling of the signals RE and /RE is started much earlier and subsequently the toggling of the signals DQS and /DQS is started, so that the latency when the dummy data is output is terminated earlier. Therefore, the timing of starting the output of the effective data is earlier than in the case of the comparative example, thereby realizing the speeding up of reading the substantial data.

The timing when the memory controller 2 starts the toggling of the signals RE and /RE with respect to the standby time $t_{WHR2}$ or the timing when the output of the dummy data is terminated and the output of the effective data is started are not limited to those as shown in FIG. 6B as the first embodiment, but may be suitably set in accordance with the design or the apparatus specification. Hereinafter, examples of setting the timings will be described.

First Setting Example

Figure 8:
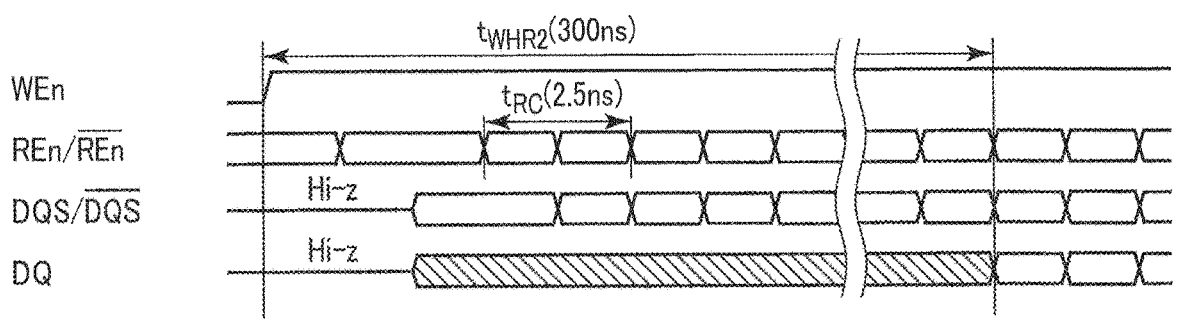
FIG. 8 is a timing chart showing timings of respective signals in a standby time and a delay time according to a first setting example.

In the first setting example shown in FIG. 8, the termination of the toggling in the standby time $t_{WHR2}$ and the termination of the output of the dummy data in the latency are set at the same timings. Namely, in this setting, at the same time as the standby time $t_{WHR2}$ is terminated, the data can be output.

First, the toggling of the signals RE and /RE is started within the period of the standby time $t_{WHR2}$. Subsequently, the toggling of the signals DQS and /DQS is started, and the output of the dummy data in the signal DQ is started. The toggling of the signals RE and /RE and the toggling of the signals DQS and /DQS continue at least until the output of the dummy data in the signal DQ is terminated.

In the first setting example, the standby time $t_{WHR2}$ is set to 300 nsec, and the 1 cycle time $t_{RC}$ of the toggling of the signals RE and /RE is set to 2.5 nsec. The times are not limited to the above settings, but can be set suitably by the memory controller 2. In the other setting examples, the times can be also set in the same manner.

Second Setting Example

Figure 9:
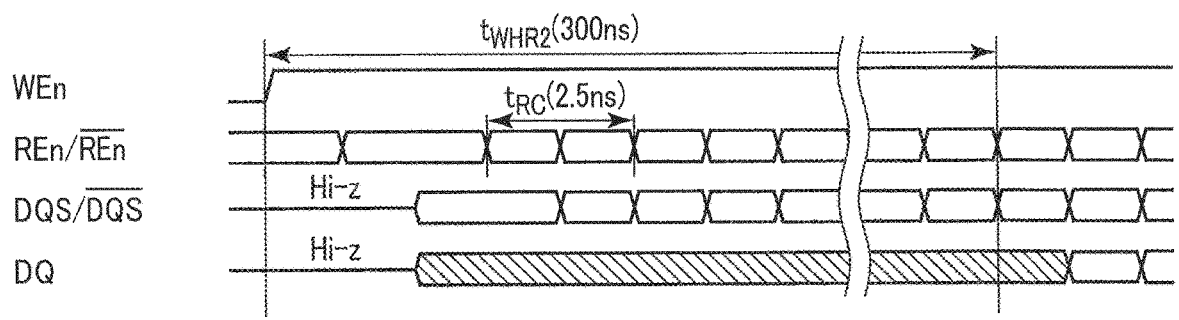
FIG. 9 is a timing chart showing timings of respective signals in a standby time and a delay time according to a second setting example.

In the second setting example shown in FIG. 9, after the toggling in the standby time $t_{WHR2}$ is terminated, the output of the dummy data in the latency is terminated. This is similar to the first embodiment. In the second setting example, the timing can be set more easily as compared to the first setting example. Also in the second setting example, the standby time $t_{WHR2}$ is set to 300 nsec, and the 1 cycle time $t_{RC}$ of the toggling of the signals RE and /RE is set to 2.5 nsec. The toggling of the signals RE and /RE and the toggling of the signals DQS and /DQS, started within the standby time $t_{WHR2}$, continue until the output of the dummy data in the signal DQ is terminated.

Third Setting Example

Figure 10:
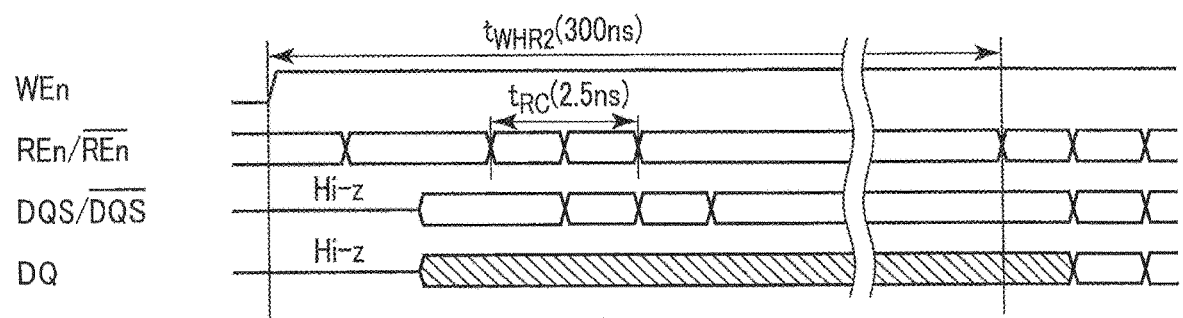
FIG. 10 is a timing chart showing timings of respective signals in a standby time and a delay time according to a third setting example.

In the third setting example shown in FIG. 10, the toggling of the signals RE and /RE and the toggling of the signals DQS and /DQS are temporarily terminated within the standby time $t_{WHR2}$, and restarted after the lapse of the standby time $t_{WHR2}$. The timings are set so that the output of the dummy data in the signal DQ in the latency is terminated at the same time as the restarting of these togglings.

Specifically, during the standby time $t_{WHR2}$, the toggling of the signals RE and /RE and the toggling of the signals DQS and /DQS are started, and the output of the dummy data is started. When the number of times of toggling of the signals RE and /RE and the signals DQS and /DQS reaches the set value within the standby time $t_{WHR2}$, the togglings are terminated, but the output of the dummy data in the signal DQ is continued. Then, the toggling of the signals RE and /RE to start the data output is withheld.

Thereafter, at the same time as the end of the standby time $t_{WHR2}$, the toggling of the signals RE and /RE and the toggling of the signals DQS and /DQS are restarted, and the output of the dummy data in the signal DQ is terminated.

In the third setting example, the standby time $t_{WHR2}$ is set to 300 nsec, and the 1 cycle time $t_{RC}$ of the toggling of the signals RE and /RE is set to 2.5 nsec.

In the third setting example, since the toggling of the signals RE and /RE and the toggling of the signals DQS and /DQS are interrupted, the power consumption can be reduced.

Fourth Setting Example

Figure 11:
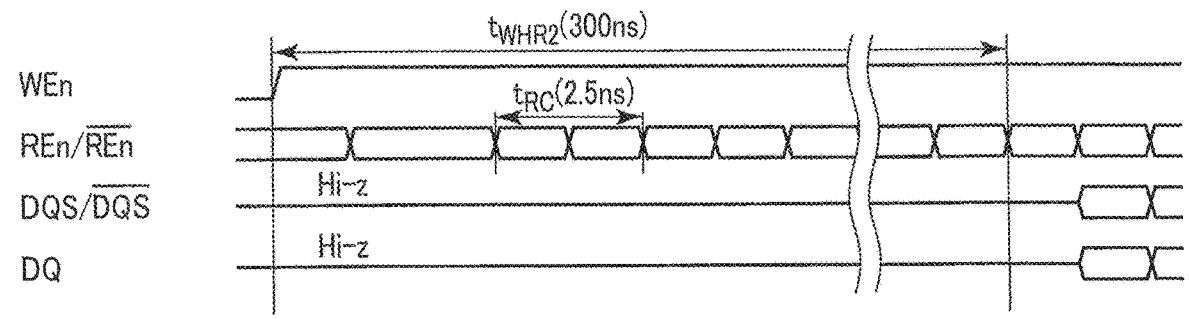
FIG. 11 is a timing chart showing timings of respective signals in a standby time and a delay time according to a fourth setting example.

In the fourth setting example shown in FIG. 11, the toggling of the signals RE and /RE is started within the standby time $t_{WHR2}$, and during the latency after the termination of the standby time $t_{WHR2}$, the toggling of the signals DQS and /DQS and the output of the dummy data in the signal DQ are started. In the fourth setting example, the standby time $t_{WHR2}$ is set to 300 nsec, and the 1 cycle time $t_{RC}$ of the toggling of the signals RE and /RE is set to 2.5 nsec. Also in the fourth setting example, the power consumption can be reduced in the same manner as in the third setting example.

Second Embodiment

Figure 12:
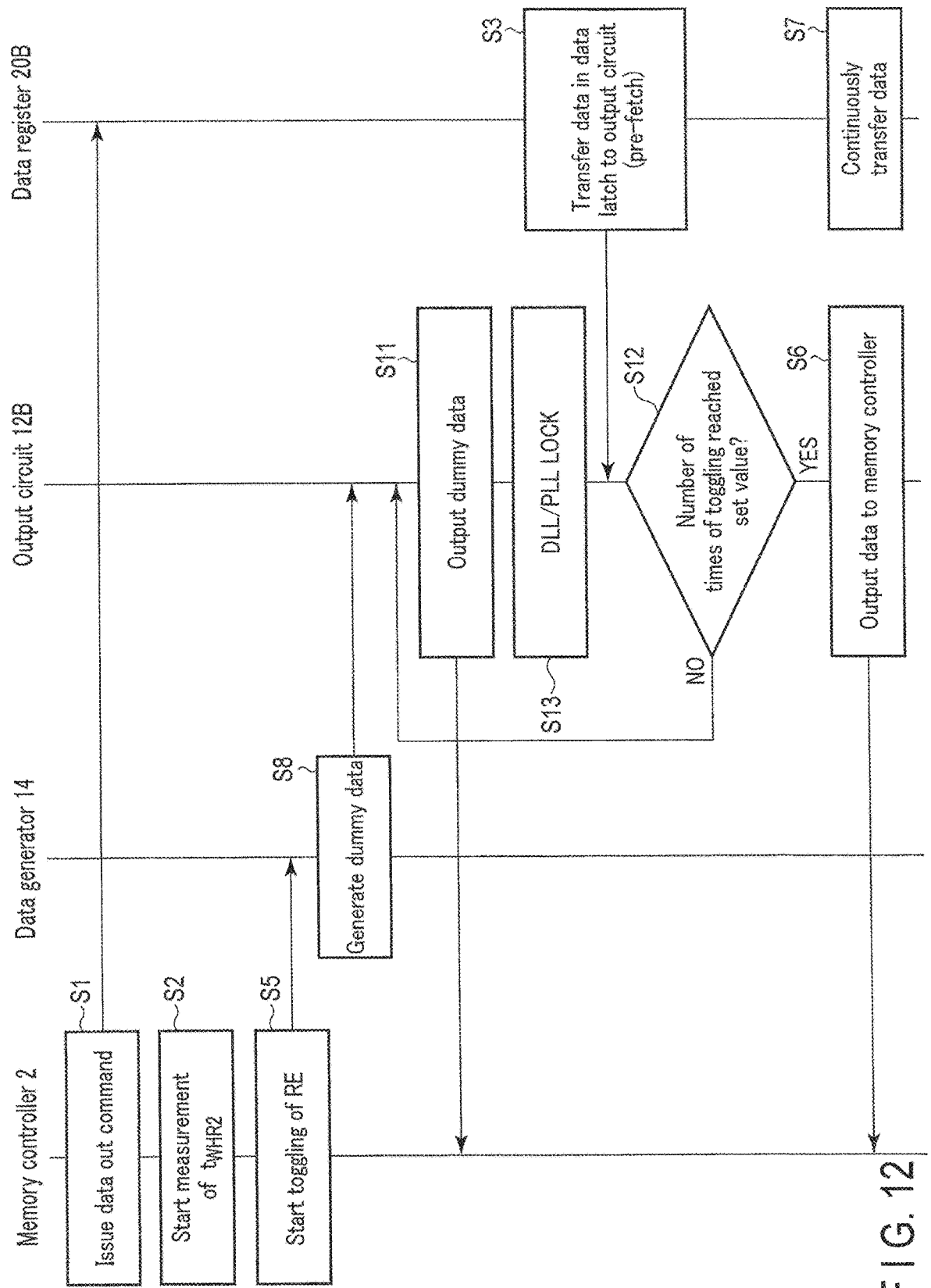
FIG. 12 is a flowchart for explaining stabilization of a power output in a data output operation according to a second embodiment.

Next, an operation of data output from the NAND-type flash memory 3 to the memory controller 2 according to the second embodiment will be described with reference to the flowchart shown in FIG. 12. The operations that are the same as those in the flowchart shown in FIG. 7 are assigned the same step numbers, and explanations thereof are simplified.

In the present embodiment, the output of the dummy data and the process of correcting the duty ratio by the PLL or DLL of the correction circuit are performed in the latency in the first embodiment described above.

First, the memory controller 2 starts toggling the signal /WE and issues the address ADD and the data out command (step S1). When the NAND-type flash memory 3 receives the data out command, the data stored in the data register 20B is transferred to the multiplexer 31D of the input/output circuit 12 (step S3). The multiplexer 31D causes, for example, 16 KByte data to be stored in units of 8 bits in the respective shift registers 31B.

When the data out command is issued and the toggling of the signal /WE is stopped, the memory controller 2 starts a time measurement (step S2). Within the period of the standby time $t_{WHR2}$, the memory controller 2 starts toggling the signals RE and /RE of the 1 cycle of the standby time $t_{RC}$ (step S4). After the toggling of the signals RE and /RE is started, the NAND-type flash memory 3 starts toggling the signals DQS and /DQS after a preset time. After the toggling of the signals DQS and /DQS is started, the data generator 14 generates dummy data and outputs it to the output circuit 12B (step S8).

The output circuit 12B outputs the dummy data to the memory controller 2 along with the signals DQS and /DQS via the signal lines DQ0 through DQ7 (step S11). In parallel with the output of the dummy data, namely within the standby time and the latency, the process of correcting the duty ratio by the PLL or DLL provided in the correction circuit 13a of the logic controller 13 is performed (step S13).

During the output of the dummy data, the data stored in the data register 20B is transferred to the multiplexer 31D (step S3). The multiplexer 31D causes, for example, 16 KByte data to be stored in units of 8 bits in the respective shift registers 31B.

Then, when the number of times of toggling the signal DQS (or the output time of the toggling) reaches a set value (step S12: YES), namely, when the latency has lapsed, the output of the data read by the shift register 31B to the memory controller 2 is started (step S6). In cooperation with this output, data can be continuously transferred from the data register 20B to the multiplexer 31D of the output circuit 12B (step S7). Furthermore, the data can be output from the output circuit 12B to the memory controller 2.

In the present embodiment, the output of the power supply can be stabilized earlier than in the comparative example, so that the data output can be started after the output of the power supply is stabilized. Furthermore, since the output of the power supply can be stabilized earlier, the latency can be set longer. Accordingly, the time to perform other processes, such as the process of correcting the duty ratio, can be ensured in the latency. Moreover, by performing the process of correcting in the standby time and the latency, a sufficient process time can be ensured, which results in the increase of the accuracy in correction.

Third Embodiment

Figure 13:
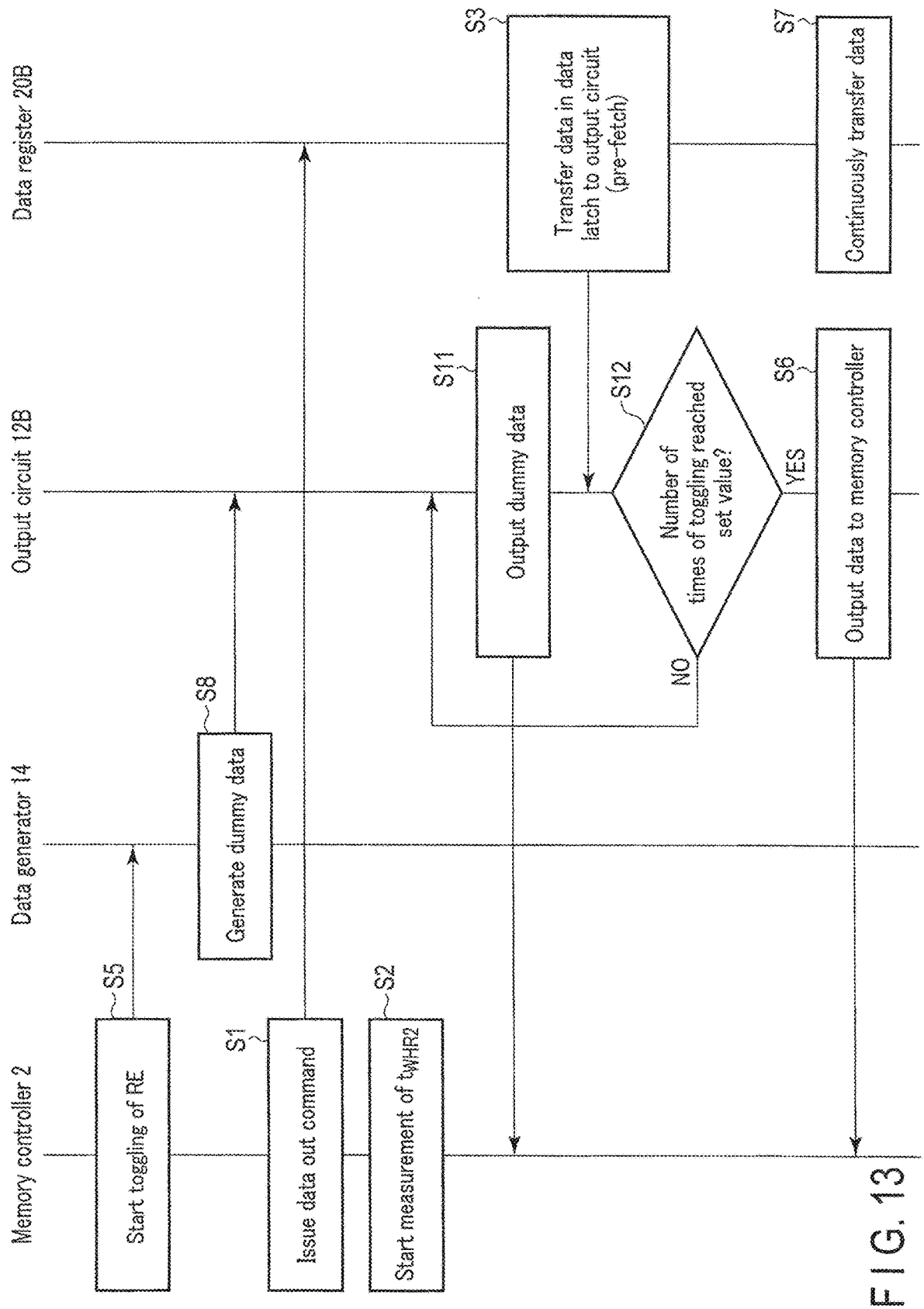
FIG. 13 is a flowchart for explaining stabilization of a power output in a data output operation according to a third embodiment.

Next, an operation of data output from the NAND-type flash memory 3 to the memory controller 2 according to the third embodiment will be described with reference to the flowchart shown in FIG. 13. The operations that are the same as those in the flowchart shown in FIG. 7 are assigned the same step numbers, and explanations thereof are simplified.

In the flow of the present embodiment, the step of issuing the data out command and the step of starting the toggling of the signals RE and /RE in the first embodiment described above are exchanged. In other words, the toggling of the signals RE and /RE is first started and thereafter the data out command is issued.

First, the memory controller 2 starts toggling the signals RE and /RE (step S5). Thereafter, the memory controller 2 issues the address ADD and the data out command (step S1). After issuing the data out command, the memory controller 2 starts a time measurement (step S2).

After starting the measurement, the memory controller 2 starts toggling the signals DQS and /DQS within the standby time $t_{WHR2}$ and after the preset time has lapsed or after the number of times of toggling the signals RE and /RE has reached the preset value. When the toggling of the signals DQS and /DQS is started, the data generator 14 generates dummy data and outputs it to the output circuit 12B (step S8).

During the latency, the output circuit 12B outputs the dummy data to the memory controller 2 along with the signals DQS and /DQS via the signal lines DQ0 through DQ7 (step S11). In the present embodiment also, the memory controller 2 determines that the received data is dummy data and does not process it.

Furthermore, when the NAND-type flash memory 3 receives the data out command, the data stored in the data register 20B is transferred to the multiplexer 31D of the input/output circuit 12 (step S3). The multiplexer 31D causes, for example, 16 KByte data to be stored in units of 8 bits in the respective shift registers 31B.

Then, for example, when the number of times of toggling the signal DQS reaches a set value (step S12: YES), namely, when the latency has lapsed, data is output from the shift register unit 31A of the output circuit 12B to the memory controller 2 (step S6). In cooperation with this output, data can be continuously transferred from the data register 20B to the multiplexer 31D of the output circuit 12B (step S7). Furthermore, the data can be output from the output circuit 12B to the memory controller 2.

As described above, according to the present embodiment, the same effect and advantage as those of the first embodiment can be obtained. Furthermore, in the present embodiment, the timing when the data out command is issued and the timing when the toggling of the signals RE and /RE is started are not specified. The data out command may be issued after the toggling of the signals RE and /RE is started. Also in the present embodiment, the reading of data from the memory cell array 11 by the sense amplifier 20 and the transfer of the data to the multiplexer 31D of the output circuit 12B can be processed at the same time or in parallel during the standby time and while the dummy data is being output. Therefore, the stabilization of the power supply can be realized and appropriate data can be output.

Fourth Embodiment

Figure 14:
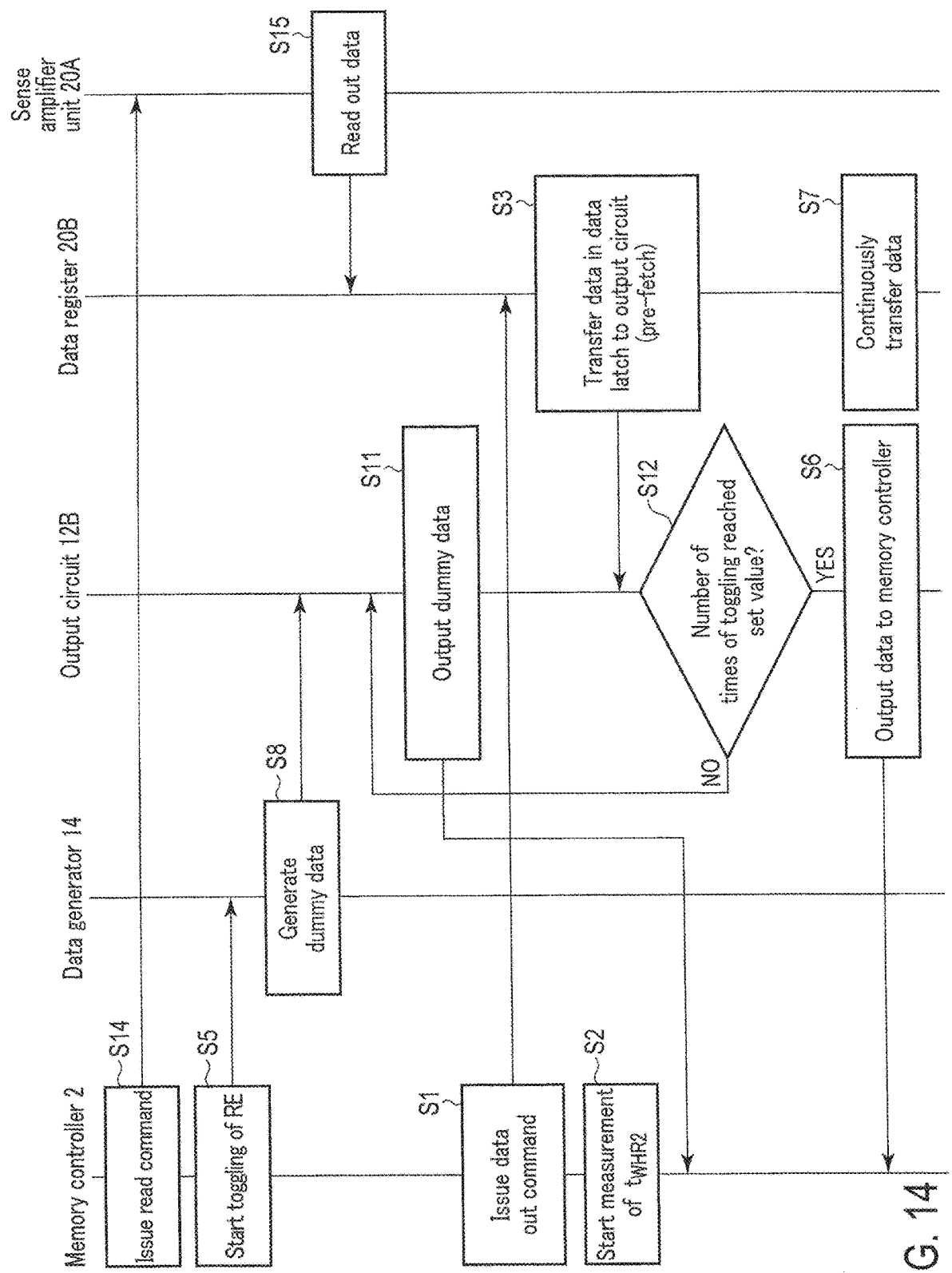
FIG. 14 is a flowchart for explaining stabilization of a power output in a data output operation according to a fourth embodiment.

Next, an operation of data output from the NAND-type flash memory 3 to the memory controller 2 according to the second embodiment will be described with reference to the flowchart shown in FIG. 14. The operations that are the same as those in the flowchart shown in FIG. 7 are assigned the same step numbers, and explanations thereof are simplified.

In the present embodiment, while the data is being output from the memory cell transistor by issuance of the read command, the toggling of the signals RE and /RE is started, and thereafter the data out command is issued.

First, the memory controller 2 issues the read command along with the address ADD etc. to the NAND-type flash memory 3 (step S14).

In response to the read command, the sense amplifier unit 20A reads data from the memory cell array 11 and causes the data register 20B to store the data (step S15). In parallel with the above step, the memory controller 2 starts toggling the signals RE and /RE (step S5).

The NAND-type flash memory 3 starts toggling the signals DQS and /DQS after the toggling of the signals RE and /RE is started. After the toggling of the signals DQS and /DQS is started, the data generator 14 generates dummy data and outputs it to the output circuit 12B (step S8). The output circuit 12B outputs the dummy data to the memory controller 2 along with the signals DQS and /DQS via the signal lines DQ0 through DQ7 (step S11). In the present embodiment also, even when the dummy data is output from the output circuit 12B to the memory controller 2, it is determined to be invalid data and is not processed.

Next, the memory controller 2 issues the data out command to the NAND-type flash memory 3 (step S1). After issuing the data out command, the memory controller 2 starts a time measurement (step S2). Within the period of the standby time $t_{WHR2}$, the data stored in the data register 20B is transferred to the multiplexer 31D of the output circuit 12B (step S3). The multiplexer 31D first causes, for example, 16 KByte data to be stored in units of 8 bits in the respective shift registers 31B.

Then, for example, when the number of times of toggling the signal DQS reaches a set value (step S12: YES), namely, when the latency is terminated, data is output from the shift register unit 31A of the output circuit 12B to the memory controller 2 (step S6). In cooperation with this output, data can be continuously transferred from the data register 20B to the multiplexer 31D of the output circuit 12B (step S7). Furthermore, the data can be output from the output circuit 12B to the memory controller 2.

As described above, according to the present embodiment, the same effect and advantage as those of the first embodiment can be obtained. In addition, according to the present embodiment, the toggling of the signals RE and /RE can be started during the period after the read command is issued and before the data out command is issued.

Fifth Embodiment

An operation of data output from the NAND-type flash memory 3 to the memory controller 2 according to the fifth embodiment will be described with reference to the timing chart shown in FIG. 15.

In the present embodiment, a get feature command is utilized instead of the read out command used in the embodiments described above, thereby outputting a set value preset in the NAND-type flash memory 3. Specifically, as shown in FIG. 15, when the memory controller 2 issues a read command XXh for a get feature command, it starts toggling the signals RE and /RE within a period (time $t_{WB}$+set time $t_{FEAT}$+time $t_{RP}$) that corresponds to the standby time $t_{WHR2}$ described above. Accordingly, the NAND-type flash memory 3 starts toggling the signals DQS and /DQS. After the toggling of the signals DQS and /DQS is started, the data generator 14 generates dummy data and outputs it to the output circuit 12B. The output circuit 12B outputs the dummy data to the memory controller 2 via the signal lines DQ0 through DQ7. Then, after the output of the dummy data is terminated, the NAND flash memory 3 outputs the set value to the memory controller 2.

The NAND-type flash memory 3 of the present embodiment stores in a feature register (not shown) the respective set values of the set time $t_{FEAT}$, the timings of starting and terminating the toggling of the signals RE and /RE, the timings of starting and terminating the toggling of the signals DQS and /DQS, the number of times of each toggling, and /or the output time of dummy data (the number of times of toggling in the dummy data if the dummy data has a pattern in which toggling is repeated, such as 55h-AAh-55h-AAh . . . ). When the NAND-type flash memory 3 receives an operation command, it operates based on the set values.

The present embodiment can also produce effects similar to those of the first embodiment.

While certain embodiments have been described, these embodiments have been presented by way of example only, and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor memory device comprising:
a memory cell array including a memory cell capable of storing data;
a signal pad to which write data to be written into the memory cell is input from an external controller and from which read data read from the memory cell is output to the external controller;
a first control pad to which a first timing control signal is input from the external controller; and
a second control pad from which a second timing control signal is output to the external controller,
wherein:
in a first time period after a data out command to instruct a data out operation is received, dummy data are output from the signal pad while the second timing control signal output from the second control pad is toggling in response to toggling of the first timing control signal input to the first control pad, and
in a second time period after the first time period, the read data are output from the signal pad while the second timing control signal output from the second control pad is toggling in response to toggling of the first timing control signal input to the first control pad.

2. The semiconductor memory device of claim 1, further comprising:
a sense amplifier unit configured to perform a read operation to read the read data from the memory cell;
a data register configured to store the read data received from the sense amplifier unit; and
an input output circuit configured to output the read data received from the data register to the signal pad.

3. The semiconductor memory device of claim 2, further comprising:
a dummy data generator configured to generate the dummy data.

4. The semiconductor memory device of claim 3, further comprising:
a sequencer configured to control the sense amplifier unit to thereby perform the read operation in response to a read command, and control the input output circuit to thereby perform the data out operation in response to the data out command.

5. The semiconductor memory device of claim 4, further comprising:
a power supply portion configured to supply a power supply voltage,
wherein:
the power supply voltage drops to a first level in the first time period after the data out command is received, and
in the second time period after the first time period, the power supply voltage maintains a second level higher than the first level.

6. The semiconductor memory device of claim 5, wherein the first time period corresponds to n times of toggling of the first timing control signal input to the first control pad, n being an integer equal to or larger than 2.

7. The semiconductor memory device of claim 6, wherein the sequencer is configured to change the number of n in response to a set feature command.

8. The semiconductor memory device of claim 1, further comprising:
a word line connected to a gate of the memory cell; and
a bit line connected to the memory cell.

9. The semiconductor memory device of claim 8, wherein the memory cell array includes a NAND string in which a plurality of memory cells are connected in series, the plurality of memory cells including the memory cell.

10. The semiconductor memory device of claim 9, further comprising:
a plurality of word lines connected to the plurality of memory cells, respectively,
wherein the bit line is connected to one end of the NAND string.

11. A storage device comprising:
a semiconductor memory; and
a memory controller connectable to a host via a host bus and coupled to the semiconductor memory via a memory bus,
wherein:
the memory controller comprises host bus terminals which transmit and accept a command and data, the semiconductor memory comprises:
  a memory cell array including a memory cell capable of storing data;
  a signal pad to which write data to be written into the memory cell is input from the memory controller and from which read data read from the memory cell is output to the memory controller;
  a first control pad to which a first timing control signal is input from the memory controller; and
  a second control pad from which a second timing control signal is output to the memory controller,
  in a first time period after a data out command to instruct a data out operation is received, dummy data are output from the signal pad while the second timing control signal output from the second control pad is toggling in response to toggling of the first timing control signal input to the first control pad, and
  in a second time period after the first time period, the read data are output from the signal pad while the second timing control signal output from the second control pad is toggling in response to toggling of the first timing control signal input to the first control pad.

12. The storage device of claim 11, wherein the semiconductor memory further comprises:
  a sense amplifier unit configured to perform a read operation to read the read data from the memory cell;
  a data register configured to store the read data received from the sense amplifier unit; and
  an input output circuit configured to output the read data received from the data register to the signal pad.

13. The storage device of claim 12, wherein the semiconductor memory further comprises:
  a sequencer configured to control the sense amplifier unit to thereby perform the read operation in response to a read command, and control the input output circuit to thereby perform the data out operation in response to the data out command.

14. The storage device of claim 13, wherein the sequencer is configured to change the number of n in response to a set feature command.

15. The storage device of claim 11, wherein the semiconductor memory further comprises:
  a dummy data generator configured to generate the dummy data.

16. The storage device of claim 11, wherein the semiconductor memory further comprises:
  a power supply portion configured to supply a power supply voltage,
  wherein:
  the power supply voltage drops to a first level in the first time period after the data out command is received, and
  in the second time period after the first time period, the power supply voltage maintains a second level higher than the first level.

17. The storage device of claim 11, wherein the first time period corresponds to n times of toggling of the first timing control signal input to the first control pad, n being an integer equal to or larger than 2.

18. The storage device of claim 11, further comprising:
  a word line connected to a gate of the memory cell; and
  a bit line connected to the memory cell.

19. The storage device of claim 18, wherein the memory cell array includes a NAND string in which a plurality of memory cells are connected in series, the plurality of memory cells including the memory cell.

20. The storage device of claim 19, further comprising:
  a plurality of word lines connected to the plurality of memory cells, respectively,
  wherein the bit line is connected to one end of the NAND string.

* * * * *